US009696369B2

(12) United States Patent
Lee et al.

(10) Patent No.: US 9,696,369 B2
(45) Date of Patent: Jul. 4, 2017

(54) WAFER TEST APPARATUS

(71) Applicant: Samsung Electronics Co., Ltd., Suwon-si (KR)

(72) Inventors: Woo-kyu Lee, Hwaseong-si (KR); In-seok Hwang, Hwaseong-si (KR); Jong-koo Kil, Yongin-si (KR); In-ki Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 138 days.

(21) Appl. No.: 14/565,946

(22) Filed: Dec. 10, 2014

(65) Prior Publication Data

US 2015/0219710 A1 Aug. 6, 2015

(30) Foreign Application Priority Data

Feb. 6, 2014 (KR) ........................ 10-2014-0013823

(51) Int. Cl.
*G01R 31/26* (2014.01)
*G01R 31/02* (2006.01)
*G01R 1/073* (2006.01)

(52) U.S. Cl.
CPC ......... *G01R 31/2601* (2013.01); *G01R 1/073* (2013.01); *G01R 31/02* (2013.01)

(58) Field of Classification Search
None
See application file for complete search history.

(56) References Cited

U.S. PATENT DOCUMENTS

| 6,791,347 | B2 | 9/2004 | Ishizaka et al. |
| 7,719,296 | B2 | 5/2010 | Amemiya et al. |
| 7,855,568 | B2 | 12/2010 | Yamada |
| 8,030,955 | B2 | 10/2011 | Yamada et al. |
| 8,723,544 | B2 | 5/2014 | Komatsu et al. |
| 2002/0190740 | A1 | 12/2002 | Ishizaka et al. |
| 2008/0079449 | A1* | 4/2008 | Hobbs ............... G01R 1/07364 324/750.25 |
| 2009/0066349 | A1 | 3/2009 | Hsu et al. |
| 2009/0219046 | A1 | 9/2009 | Yamada et al. |
| 2009/0315580 | A1 | 12/2009 | Yamada |
| 2011/0181314 | A1* | 7/2011 | Hwang ............... G01R 31/2891 324/756.03 |
| 2011/0234251 | A1 | 9/2011 | Komatsu et al. |

FOREIGN PATENT DOCUMENTS

| JP | 3891798 | | 3/2007 |
| JP | 2009204492 | | 9/2009 |
| JP | 2010133787 | | 6/2010 |
| JP | 2011141263 A | * | 7/2011 |
| JP | 5222038 | | 6/2013 |
| KR | 101020152 | | 3/2011 |
| KR | 101032959 | | 5/2011 |
| KR | 101089225 | | 12/2011 |

* cited by examiner

*Primary Examiner* — Paresh Patel
(74) *Attorney, Agent, or Firm* — Onello & Mello, LLP

(57) ABSTRACT

A wafer test apparatus includes a probe station comprising a probe card that contacts a wafer positioned on a chuck during a wafer test. A test head is disposed on the probe card and tests electrical characteristics of a semiconductor chip positioned on the wafer. A probe card horizontality adjustment unit is positioned between the test head and the probe card and adjusts horizontality of the probe card during the wafer test.

17 Claims, 17 Drawing Sheets

WAFER TEST APPARATUS

CROSS-REFERENCE TO RELATED APPLICATIONS

This application claims the benefit of Korean Patent Application No. 10-2014-0013823, filed on Feb. 6, 2014, in the Korean Intellectual Property Office, the disclosure of which is incorporated herein in its entirety by reference.

BACKGROUND

The inventive concepts relate to a wafer test apparatus, and more particularly, to a wafer test apparatus that performs an electrical test on a semiconductor chip that is formed on a wafer.

Following the fabrication of semiconductor chips on a wafer, electrical tests may be performed on the plurality of semiconductor chips. A wafer test apparatus including a probe card is used for this purpose. During an electrical test, the probe card is configured to come in contact with the chips for the transfer of signals. It is desired that such contact by the probe card occur at uniform pressure.

SUMMARY

A wafer test apparatus is constructed and arranged to test semiconductor chips on a wafer while enabling a probe card to contact the semiconductor chips at uniform pressure.

According to an aspect of the inventive concepts, there is provided a wafer test apparatus comprising: a probe station comprising a probe card that contacts a wafer positioned on a chuck during a wafer test; a test head that is disposed on the probe card and tests electrical characteristics of a semiconductor chip positioned on the wafer; and a probe card horizontality adjustment unit positioned between the test head and the probe card that adjusts horizontality of the probe card during the wafer test.

In some embodiments, the probe card horizontality adjustment unit comprises: an inner circumferential body having a through-hole; an outer circumferential body disposed about an outer circumferential surface of the inner circumferential body; a plurality of connection portions that connect the inner circumferential body and the outer circumferential body about the through-hole; and a probe card weight adjustment member that is provided on each of the plurality of connection portions and adjusts a force applied to the probe card.

In some embodiments, the plurality of connection portions are provided opposite each other about the through-hole, wherein the probe card weight adjustment member is provided on the plurality of connection portions opposite each other about the through-hole.

In some embodiments, the probe card weight adjustment member comprises a plurality of spring members that are provided on the plurality of connection portions.

In some embodiments, the probe card weight adjustment member comprises a probe card weight sensor that measures the force applied to the probe card and a probe card actuator that adjusts the horizontality of the probe card.

In some embodiments, a weight data electrical signal of the probe card weight sensor is input to a weight controller that is provided in the test head, the weight data electrical signal that is input to the weight controller being input to a flow rate controller that is provided in the test head, and the flow rate controller adjusting the probe card actuator according to the weight data electrical signal.

In some embodiments, the test head comprises: a support plate that has a bottom surface supporting the probe card that contacts the wafer during the wafer test; a circuit board that is provided on a top surface of the support plate and transmitting an electrical signal for test to the probe card; and a connection plate that is provided on a top surface of the circuit board and is connected to the support plate through a connection pillar that passes through the circuit board.

In some embodiments, a guide member that guides only a vertical movement of the support plate is provided on an outer circumferential surface of the connection pillar.

In some embodiments, a circuit board horizontality adjustment unit that adjusts the horizontality of the circuit board connected to the probe card during the wafer test is provided on the connection plate.

In some embodiments, the circuit board horizontality adjustment unit comprises a circuit board weight adjustment member that is provided on the connection plate and adjusts a weight of the probe card.

In some embodiments, the circuit board weight adjustment member comprises a circuit board weight sensor that is provided on the connection plate and measures a weight applied to the circuit board, and a spring member that is disposed on the circuit board weight sensor.

In some embodiments, the circuit board weight adjustment member comprises a circuit board weight sensor that is provided on the connection plate and measures a weight applied to the circuit board, and a circuit board actuator that adjusts horizontality of the circuit board.

In some embodiments, the test head comprises: a support plate comprising a probe having a cantilever structure that contacts the wafer during the wafer test; a circuit board that is provided on a top surface of the support plate and transmits an electrical signal for test to the probe card; and a connection plate that is provided on a top surface of the circuit board and is connected to the support plate through a connection pillar that passes through the circuit board, wherein the support plate functions as the probe card during the wafer test.

In another aspect of the inventive concepts, a wafer test apparatus comprises: a probe station comprising a probe card that contacts a wafer placed on a chuck during a wafer test; a test head disposed on the probe card and that transmits an electrical signal for test to the probe card; a circuit board horizontality adjustment unit positioned on the circuit board of the test head and constructed and arranged to adjust horizontality of the circuit board during the wafer test; and a probe card horizontality adjustment unit positioned under the test head and constructed and arranged to adjust horizontality of the probe card during the wafer test.

In some embodiments, the circuit board horizontality adjustment unit and the probe card horizontality adjustment unit comprise a spring member, or an actuator that operates according to a weight sensor.

In another aspect of the inventive concepts, a probe card horizontality adjustment unit for a test apparatus, comprises: an upper portion constructed and arranged to contact a test head of the test apparatus; a lower portion constructed and arranged to contact a probe card of the test apparatus; and a horizontality adjustment unit positioned at at least one of the lower portion and upper portion that adjusts horizontality of a force applied to the probe card by the test head.

In some embodiments, the horizontality adjustment unit comprises a plurality of spring members arranged at the at least one of the lower portion and upper portion.

In some embodiments, the horizontality adjustment unit comprises: a plurality of probe card force sensors that detect forces applied to the probe card by the test head at positions corresponding to the probe card force sensors; and a plurality of probe card actuators that adjust the horizontality of the probe card in response to the detected forces.

In some embodiments, the probe card horizontality adjustment unit further comprises a force controller that receives force signals corresponding to the forces, and, in response to the received force signals, generates actuator signals for controlling the probe card actuators.

In some embodiments, the probe card horizontality adjustment unit further comprises: an inner circumferential body between the upper portion and lower portion having an opening; an outer circumferential body disposed about the inner circumferential body; and a plurality of connection portions that connect the inner circumferential body and the outer circumferential body about the opening, wherein the horizontality adjustment unit is provided on the plurality of connection portions.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF EMBODIMENTS

Figure 1:
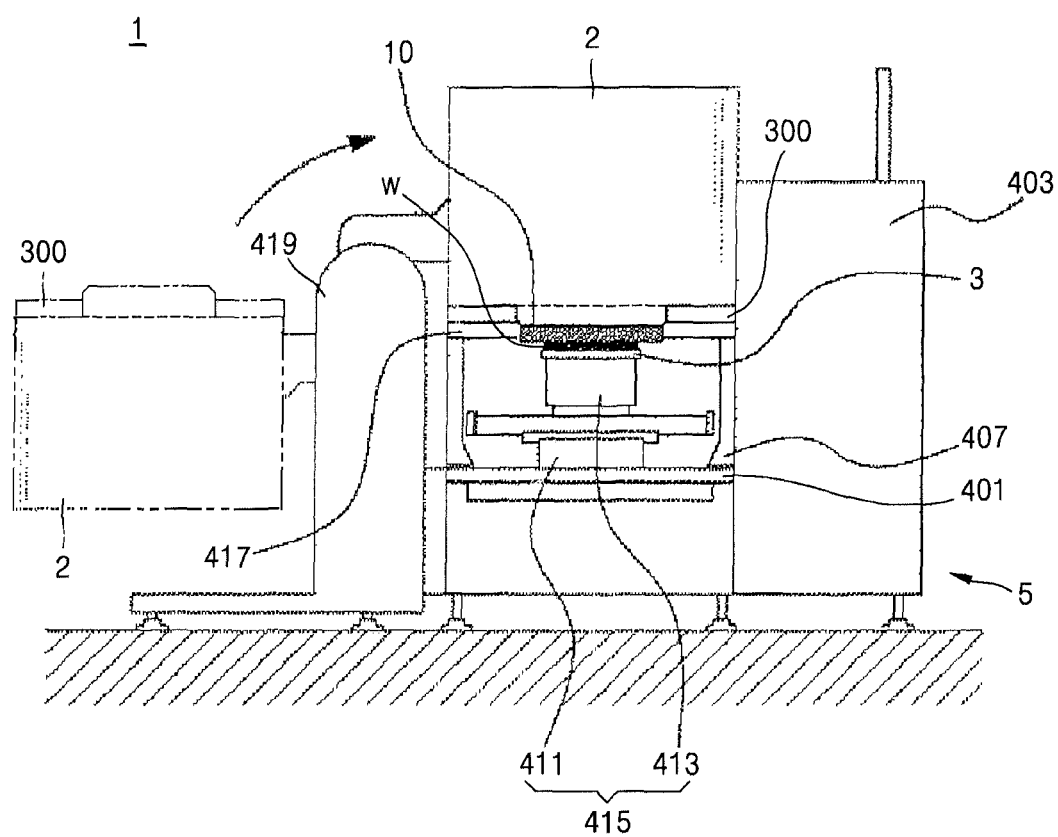
FIG. 1 is a cross-sectional view illustrating a wafer test apparatus according to an embodiment of the inventive concepts.

The inventive concepts will now be described more fully with reference to the accompanying drawings, in which exemplary embodiments of the inventive concepts are shown. The inventive concepts may, however, be embodied in many different forms and should not be construed as being limited to the embodiments set forth herein; rather these embodiments are provided so that this disclosure will be thorough and complete, and will fully convey the concept of the inventive concepts to one of ordinary skill in the art. Also, thicknesses or sizes of layers in the drawings are exaggerated for clarity and convenience of explanation.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals denote like elements throughout.

It will be understood that, although the terms first, second, third etc. may be used herein to describe various members, parts, regions, layers, and/or portions, these members, parts, regions, layers, and/or portions should not be limited by these terms. These terms are only used to distinguish one member, part, region, or portion from another member, part, region, or portion. Thus, a first member, part, region, or portion discussed below could be termed a second member, part, region, or portion without departing from the teachings of exemplary embodiments.

Spatially relative terms, such as "above," "upper," "beneath," "below," "lower," and the like, may be used herein for ease of description to describe one element's relationship to another element(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements would then be oriented "above" the other elements. Thus, the exemplary term "above" may encompass both an orientation of above and below. The device may be otherwise oriented (rotated 90 degrees or at other orientations) and spatially relative descriptors used herein interpreted accordingly.

The terminology used herein is for the purpose of describing exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof Embodiments are described herein with reference to illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. The embodiments of the inventive concepts may be implemented as one or a combination thereof. As used herein, the term "and/or" includes any and all combinations of one or more of the associated listed items.

FIG. 1 is a cross-sectional view illustrating a wafer test apparatus 1 according to an embodiment of the inventive concepts.

In detail, the wafer test apparatus 1 may include a test head 2 that may test electrical characteristics of semiconductor chips on the wafer by applying electrical signals to one or more semiconductor chips that are disposed on a wafer W, and a probe station 5 including a probe card 10 that enables the electrical signals applied from the test head 2 to be transmitted to the one or more semiconductor chips.

In some embodiments, a probe card horizontality adjustment unit 300 may be provided under the test head 2, and a circuit board horizontality adjustment unit 20 (see FIGS. 9A and 9B) may be provided in the test head 2. In some embodiments, the test head 2 may be mounted on a manipulator 419.

The probe station 5 may include a base frame 401, a support pillar 407 that is formed on an edge of the base frame 401, and a probe card holder 417 that is disposed on the support pillar 407. The probe card 10 may be mounted in the probe card holder 417 on the support pillar 407.

The probe station 5 may include a chuck transfer unit 415 and a loader 403. The chuck transfer unit 415 may be disposed on the base frame 401. A chuck 3 on which the wafer W is placed may be disposed on the chuck transfer unit 415. The chuck transfer unit 415 may include an XY stage 411 that moves the chuck 3 in a horizontal direction (left-right direction, XY direction) and a Z stage 413 that moves the chuck 3 in a vertical direction (up-down direction, Z direction). The loader 403 that transfers the wafer W to be tested from a cassette to the chuck 3 may be disposed at a side of the chuck transfer unit 415.

The test head 2 may drive the manipulator 419 to rotate the manipulator 419 in a direction marked by an arrow so that the test head 2 and the probe card 10 may contact each other. Also, the chuck transfer unit 415 may horizontally and vertically move the chuck 3 so that the wafer W and the probe card 10 may contact each other. When the wafer W and the probe card 10 are properly in contact with each other, the semiconductor chip may be tested.

Once the test head 2 and the probe card 10 are in contact with each other, a weight of the test head 2 may be transferred or applied to the probe card 10 and the wafer W. When the weight of the test head 2 is not uniformly applied to the entire probe card 10 and the wafer W, the pressure of the test head 2 is not uniformly applied and uniform contact between the probe card 10 and the wafer W may not be achieved.

Furthermore, when the chuck transfer unit 415 may move the chuck 3 upward and thus the wafer W contacts the probe card 10, the probe card 10 may be bent as a result of the non-uniform applied pressure. This may result in improper testing of a portion of the semiconductor chip disposed on the wafer W. Accordingly, in some embodiments, the probe card horizontality adjustment unit 300 may be provided under the test head 2 and may maintain horizontality by directly adjusting the pressure applied to the probe card 10. In some embodiments, the probe card horizontality adjustment unit 300 may be provided under the test head 2 and over the probe card 10. In some embodiments, the probe card horizontality adjustment unit 300 may be provided between the test head 2 and the probe card 10.

In addition, in some embodiments, the circuit board horizontality adjustment unit 20 (see FIGS. 9A and 9B) that may adjust horizontality of a circuit board 12 that is connected to the probe card 10 may be provided in the test head 2. The configuration and operation of the probe card horizontality adjustment unit 300 and the circuit board horizontality adjustment unit 20 (see FIGS. 9A and 9B) will be explained herein in detail.

Figure 2:
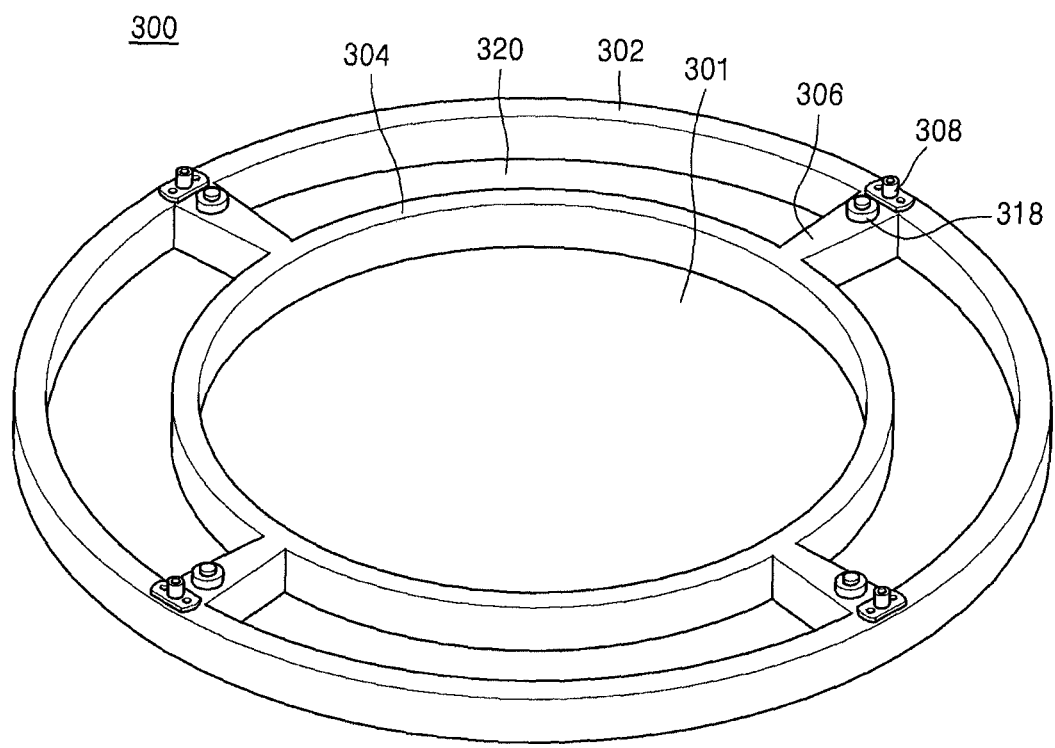
FIGS. 2 through 4 are perspective views illustrating a probe card horizontality adjustment unit of the wafer test apparatus, according to an embodiment of the inventive concepts.
Figure 3:
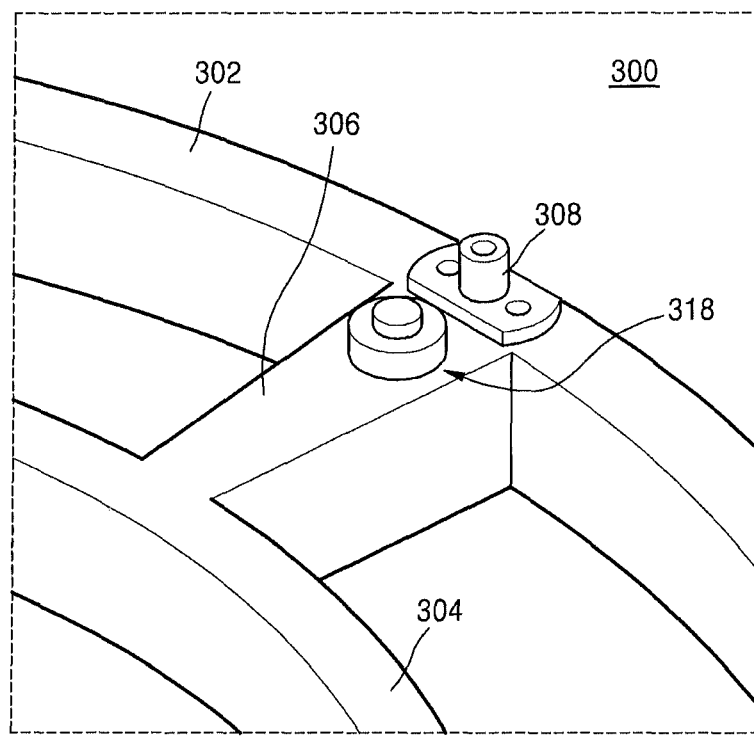
Figure 4:
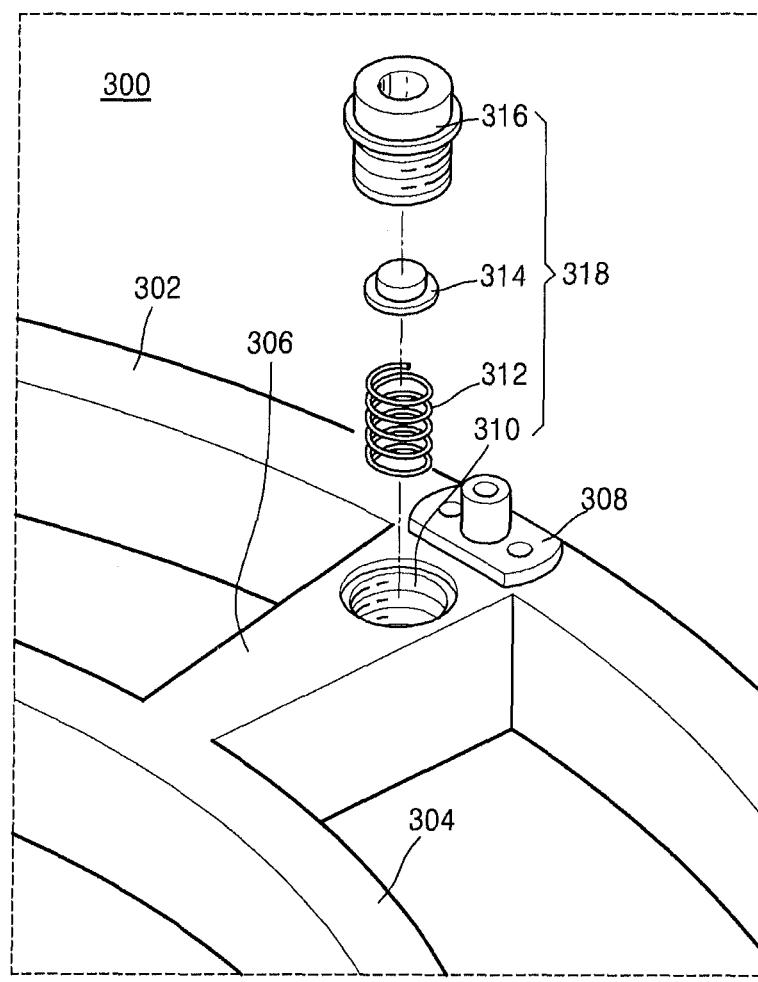

FIGS. 2 through 4 are perspective views illustrating the probe card horizontality adjustment unit 30Q of the wafer test apparatus 1 of FIG. 1, according to an embodiment of the inventive concepts.

In detail, FIG. 2 is a perspective view illustrating the probe card horizontality adjustment unit 300. An upper portion of the unit 300 may be a portion that faces the probe card 10 (see FIG. 1). FIG. 3 is a partial enlarged perspective view of FIG. 2. FIG. 4 is an exploded perspective view illustrating a probe card weight adjustment member 318 of FIG. 3.

The probe card horizontality adjustment unit 300 may have a circular disk shape corresponding to a shape of the wafer W as shown in FIG. 2. The probe card horizontality adjustment unit 300 may include an inner circumferential body 304 having a through-hole 301, and an outer circumferential body 302 that is positioned around an outer circumferential surface of the inner circumferential body 304. The through-hole 301 may be a hole that is positioned at a central portion and into which the probe card 10 (see FIG. 1) is inserted. An insertion member 308 that may be inserted into the probe card holder 417 (see FIG. 1) may be provided on the outer circumferential body 302. A through-portion 320 formed between the inner circumferential body 304 and the outer circumferential body 302 may be a portion that may be inserted into or coupled to the probe card holder 417 (see FIG. 1).

In some embodiments, the probe card horizontality adjustment unit 300 may include a plurality of connection portions 306 that connect the inner circumferential body 304 and the outer circumferential body 302 about the through-hole 301. The connection portions 306 may be provided to face each other about the through-hole 301. The probe card horizontality adjustment unit 300 may include the probe card weight adjustment member 318 that is provided on each of the connection portions 306 and adjusts a weight of the probe card 10. A probe card weight adjustment member 318 may be provided on each of the connection portions 306 that are provided to face each other about the through-hole 301. In some embodiments, the probe card weight adjustment members 318 may be provided on all of the connection portions 306, or may be provided on a subset of the connection portions 306. In some embodiments, the probe card weight adjustment member 318 may include a spring member 312 that may maintain horizontality by directly adjusting a pressure applied to the probe card 10. The spring member 312 of the probe card weight adjustment member 318 may be supported by using any of various methods. In some embodiments, the probe weight adjustment members 318 may be positioned at at least one of the lower portion and upper portion of the horizontality adjustment unit 300, for example, at upper or lower portions of the connection portions 306 of the horizontality adjustment unit 300.

For example, as shown in FIG. 4, the probe card weight adjustment member 318 may include a screw hole 310 that is provided in some or all of the connection portions 306 and has a screw groove, or thread, formed therein. A spring member 312 is inserted into the screw hole 310. An inner cover 314 covers the spring member 312 and is constructed and arranged to bear an external weight. An outer cover 316 has a screw thread formed on an outer surface thereof and is inserted into and coupled to the screw hole 310. When assembled, an outer portion of the inner cover 314 protrudes external to the inner hole 310, for example through an opening in the outer cover. The outer cover retains the remainder of the inner cover 314, thereby preventing its release from the screw hole 310. When the inner cover 314 is placed in a position so as to bear weight, the spring member 312 may operate to absorb or reduce the weight. Accordingly, the wafer test apparatus 1 of the present embodiment may include the probe card weight adjustment member 318 of the probe card horizontality adjustment unit 300 and thus maintain horizontality by directly adjusting a pressure applied to the probe card 10.

Figure 5:
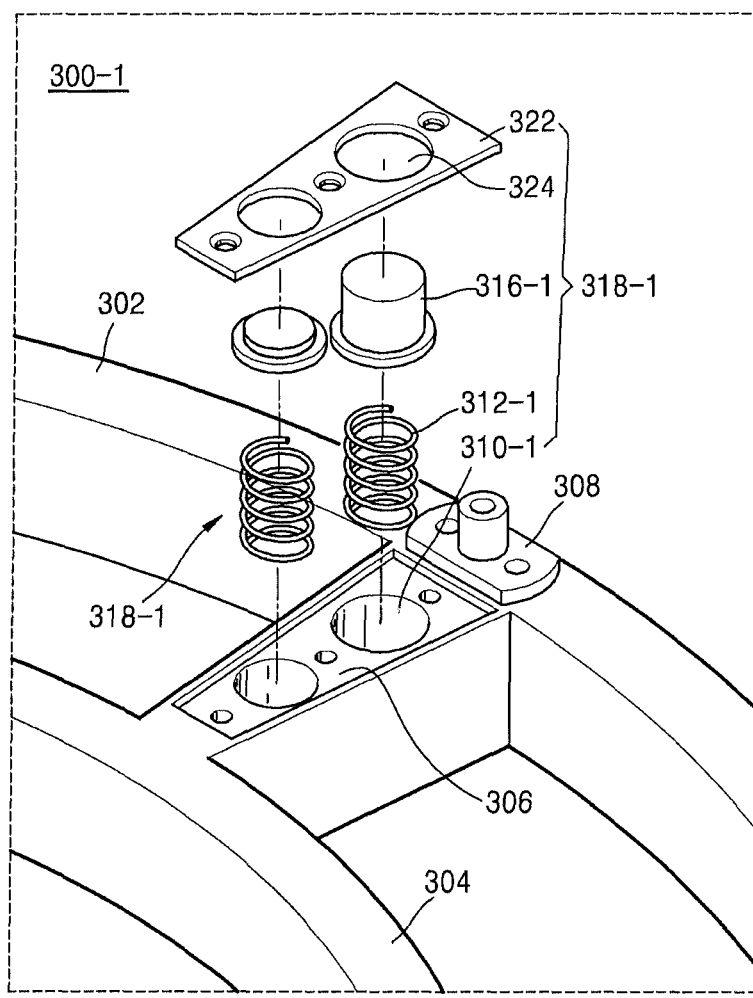
FIG. 5 is an exploded perspective view illustrating a probe card horizontality adjustment unit of the wafer test apparatus, according to another embodiment of the inventive concepts.

FIG. 5 is an exploded perspective view illustrating a probe card horizontality adjustment unit 300-1 of the wafer test apparatus 1, according to another embodiment of the inventive concepts.

In detail, the probe card horizontality adjustment unit 300-1 of FIG. 5 is largely similar to the probe card horizontality adjustment unit 300 depicted in FIGS. 2 through 4, the exception being the inclusion of a second probe card weight adjustment member 318-1.

As shown, a plurality of the probe card weight adjustment members 318-1 may be provided on some or all of the plurality of connection portions 306. As described herein, the the probe card weight adjustment members 318-1 may comprise a hole 310-1 formed in the connection portion 306, a spring member 312-1 inserted into the hole 310-1, a cover 316-1 that covers the spring member 312-1, and a cap 322 that includes a cover hole 324 corresponding to the cover 316-1 which allows a portion of the cover to protrude external to the hole and prevents the remainder of the cover 316 from being released.

The cap 322 may couple and support the plurality of probe card weight adjustment members 318-1. When the cover 316-1 is placed in a position to bear weight, the spring member 312 may function to reduce or absorb the weight. Also, in embodiment where the wafer test apparatus 1 includes the plurality of probe card weight adjustment members 318-1 as shown in FIG. 5, for example, two or more such members 318-1 along a given connection portion, a weight applied to the probe card 10 may be more effectively adjusted during operation.

Figure 6:
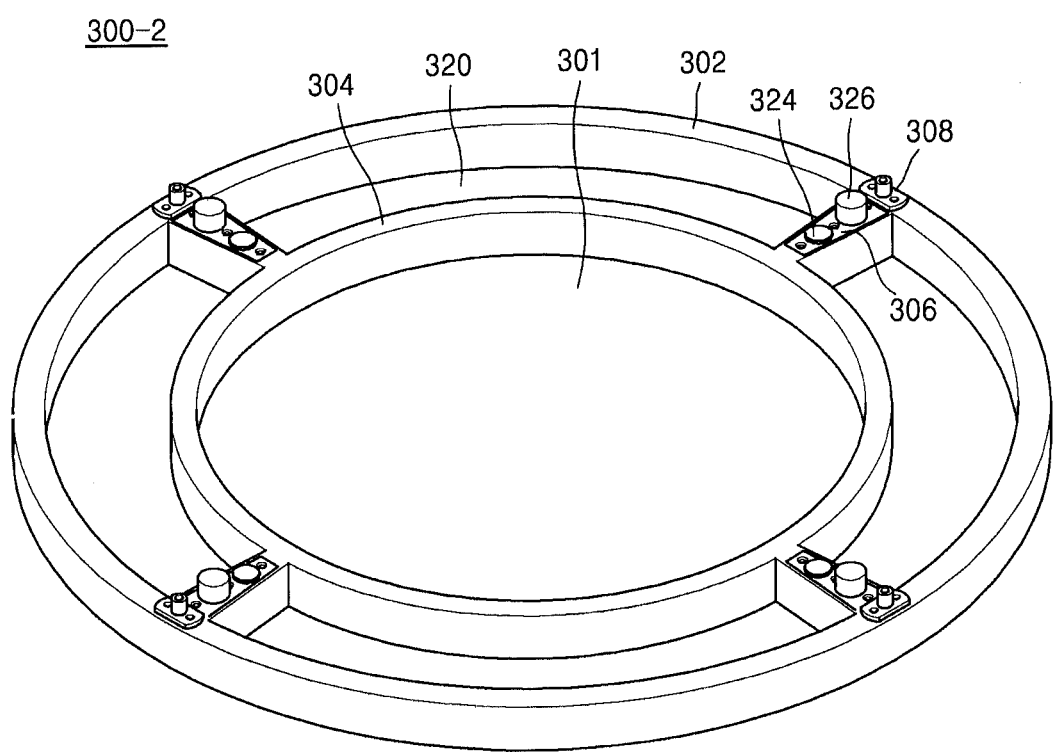
FIG. 6 is a perspective view illustrating a probe card horizontality adjustment unit of the wafer test apparatus, according to another embodiment of the inventive concepts.
Figure 7:
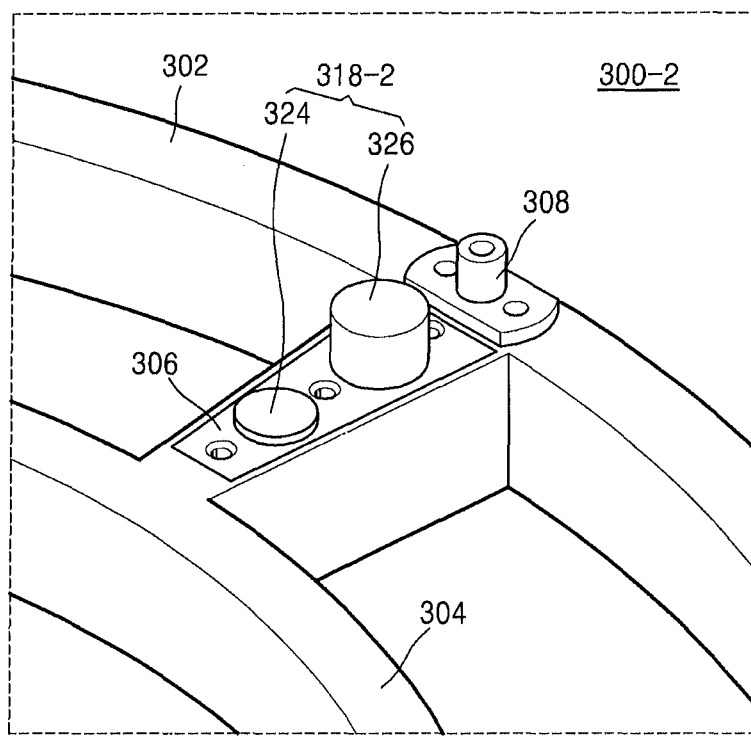
FIG. 7 is a partial enlarged perspective view of FIG. 6.

FIG. 6 is a perspective view illustrating a probe card horizontality adjustment unit 300-2 of the wafer test apparatus 1, according to another embodiment of the inventive concepts. FIG. 7 is a partial enlarged perspective view of FIG. 6.

In detail, an upper portion of the probe card horizontality adjustment unit 300-2 of FIGS. 6 and 7 may be a portion that faces the probe card 10 (see FIG. 1). The probe card horizontality adjustment unit 300-2 of FIG. 6 is the same as the probe card horizontality adjustment unit 300 of FIGS. 2 through 4 except for the inclusion of a plurality of second probe card weight adjustment members 318-2.

The probe card weight adjustment member 318-2 may include the probe card weight sensor 324 and a probe card actuator 326 that are provided on the connection portion 306. The probe card weight sensor 324 may measure a weight or force applied to the probe card 10 (see FIG. 1). The probe card actuator 326 may adjust horizontality of the probe card 10 by reflecting or offsetting the weight measured by the probe card weight sensor 324.

Figure 8A:
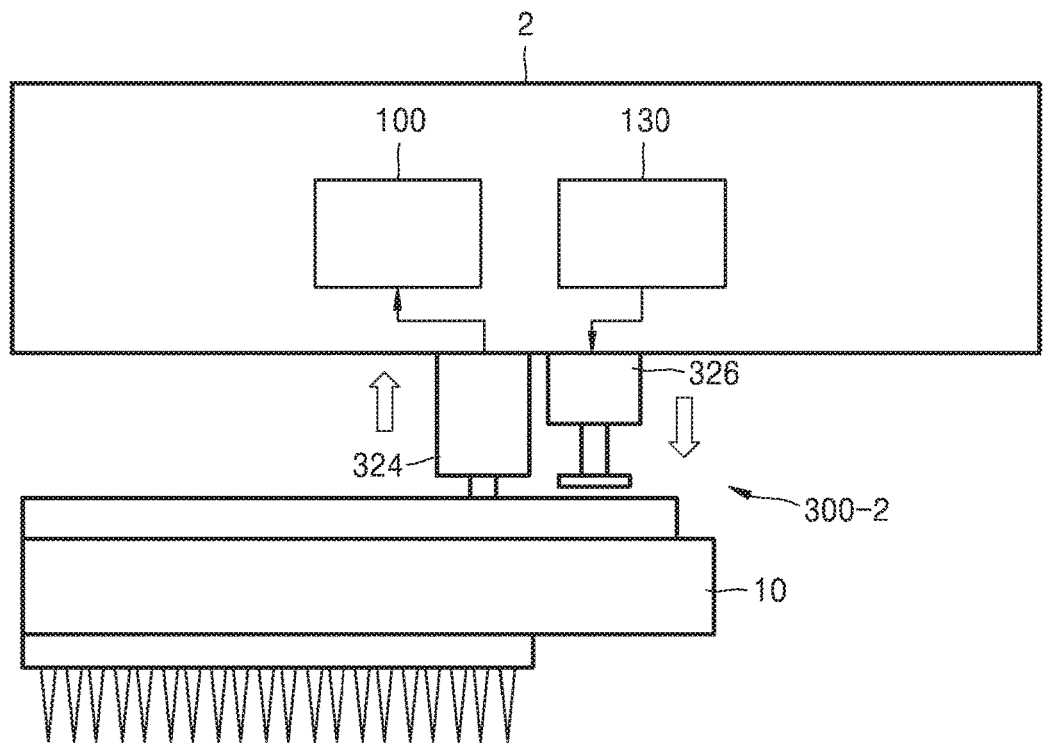
FIGS. 8A and 8B are a view and a block diagram for explaining a method of adjusting a weight of the probe card of the wafer test apparatus including the probe card horizontality adjustment unit of the embodiment of FIG. 6, according to an embodiment of the inventive concepts.
Figure 8B:
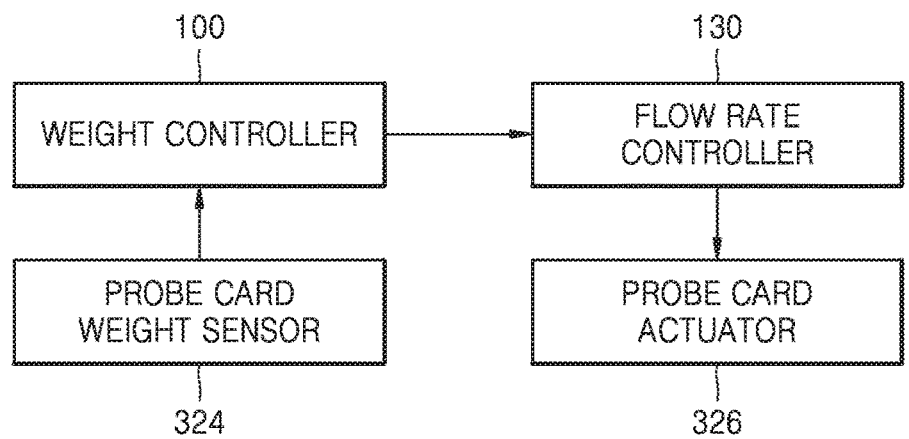

In other words, referring to FIGS. 1, 8A and 8B, a weight data electrical signal of the probe card weight sensor 324 may be input to a weight controller 100 that is provided in the test head 2, the weight data electrical signal that is input to the weight controller 100 may be input to a flow rate controller 130 that is provided in the test head 2, and the flow rate controller 130 may adjust the probe card actuator 326 according to the weight data electrical signal. As such, the probe card horizontality adjustment unit 300-2 may include the probe card weight sensor 324 and the probe card actuator 326 and thus may effectively adjust a weight applied to the probe card 10 (see FIG. 1).

FIGS. 8A and 8B are a view and a block diagram for explaining a system and method for adjusting a weight of the probe card 10 of the wafer test apparatus 1 including the probe card horizontality adjustment unit 300-2 of FIG. 6, according to an embodiment of the inventive concepts.

In detail, FIG. 8A is a view illustrating the wafer test apparatus 1 including the probe card horizontality adjustment unit 300-2 and the test head 2 of FIGS. 6 and 7. FIG. 8B is a block diagram illustrating signal flow between the probe card horizontality adjustment unit 300-2 and the test head 2 of FIGS. 6 and 7.

As described above, the probe card horizontality adjustment unit 300-2 may be disposed on the probe card 10 and may include the probe card weight sensor 324 and the probe card actuator 326. The test head 2 may include the weight controller 100 and the flow rate controller 130. A weight data signal provided by the probe card weight sensor 324 may be input to the weight controller 100 of the test head 2.

The weight data signal that is input to the weight controller 100 may be further input to the flow rate controller 130 that is provided in the test head 2. The flow rate controller 130 may adjust the probe card actuator 326 according to the weight data signal. Accordingly, a weight applied to the probe card 10 may be readily adjusted by using the probe card weight sensor 324, the weight controller 100, the flow rate controller 130, and the probe card actuator 326.

Further detailed examples of the wafer test apparatus 1 (see FIG. 1) including the probe card horizontality adjustment unit 300 will be explained below. For convenience of explanation, the probe card horizontality adjustment unit including the spring member 312 or 312-1 is denoted by reference numeral 300-1, and the probe card horizontality adjustment unit including the probe card weight sensor 324 and the probe card actuator 326 is denoted by reference numeral 300-2.

In some embodiments, the wafer test apparatus 1 below may include the circuit board horizontality adjustment unit 20 (see FIGS. 9A and 9B) that may adjust horizontality of the circuit board 12 that is connected to the probe card 10. Both the probe card horizontality adjustment unit 300-1 or 300-2 and the circuit board horizontality adjustment unit 20 (see FIGS. 9A and 9B) may be provided or one of the probe card horizontality adjustment unit 300-1 or 300-2 and the circuit board horizontality adjustment unit 20 (see FIGS. 9A and 9B) may be selectively added as desired.

Figure 9A:
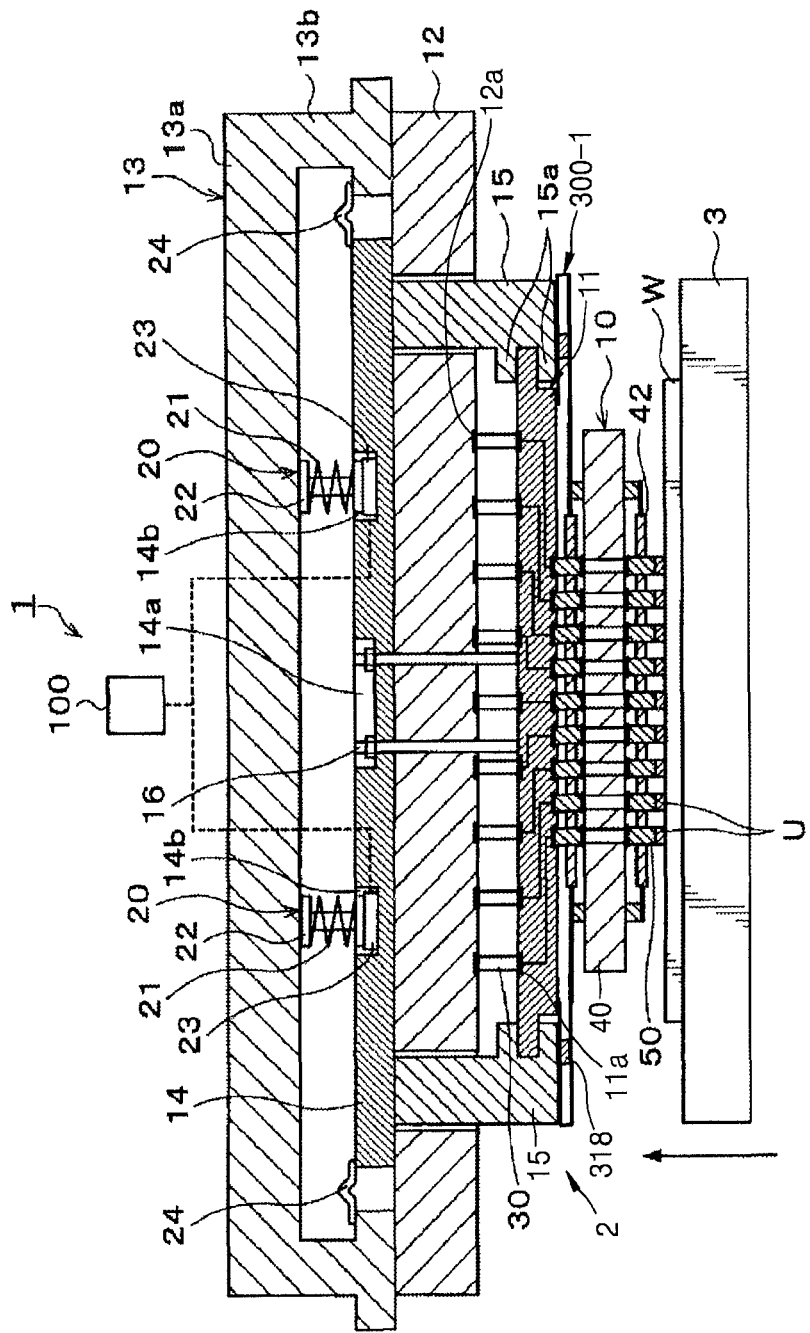
FIGS. 9A and 9B are cross-sectional views illustrating the wafer test apparatus according to another embodiment of the inventive concepts.
Figure 9B:
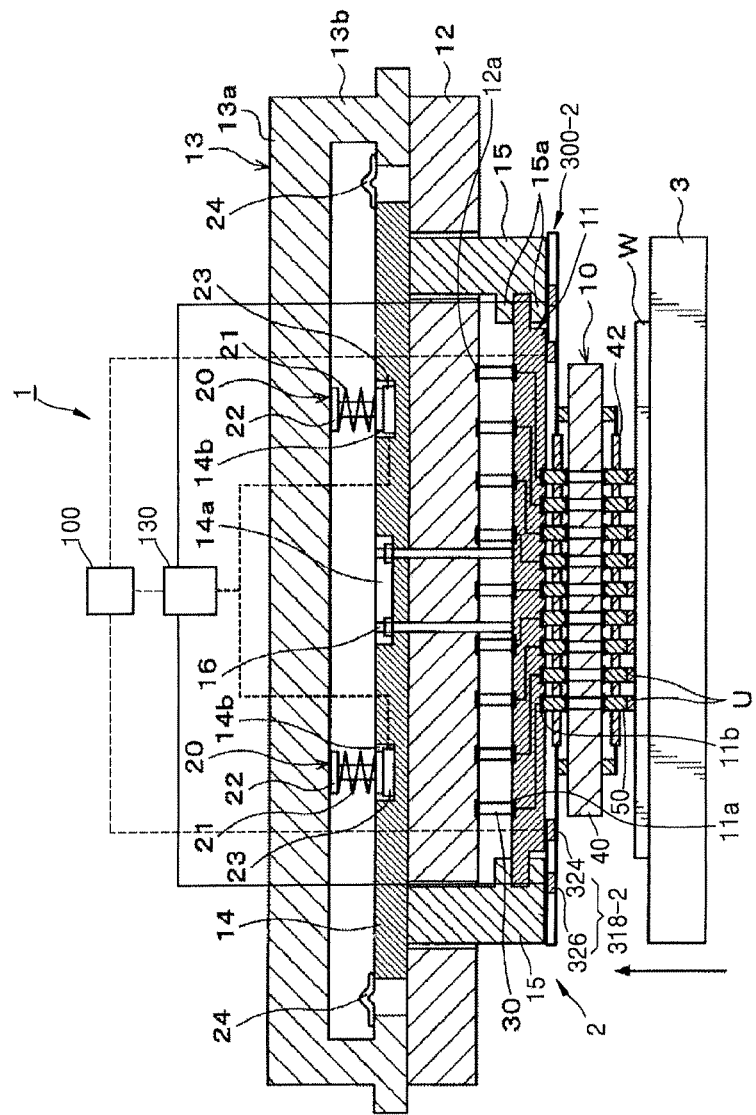
Figure 10:
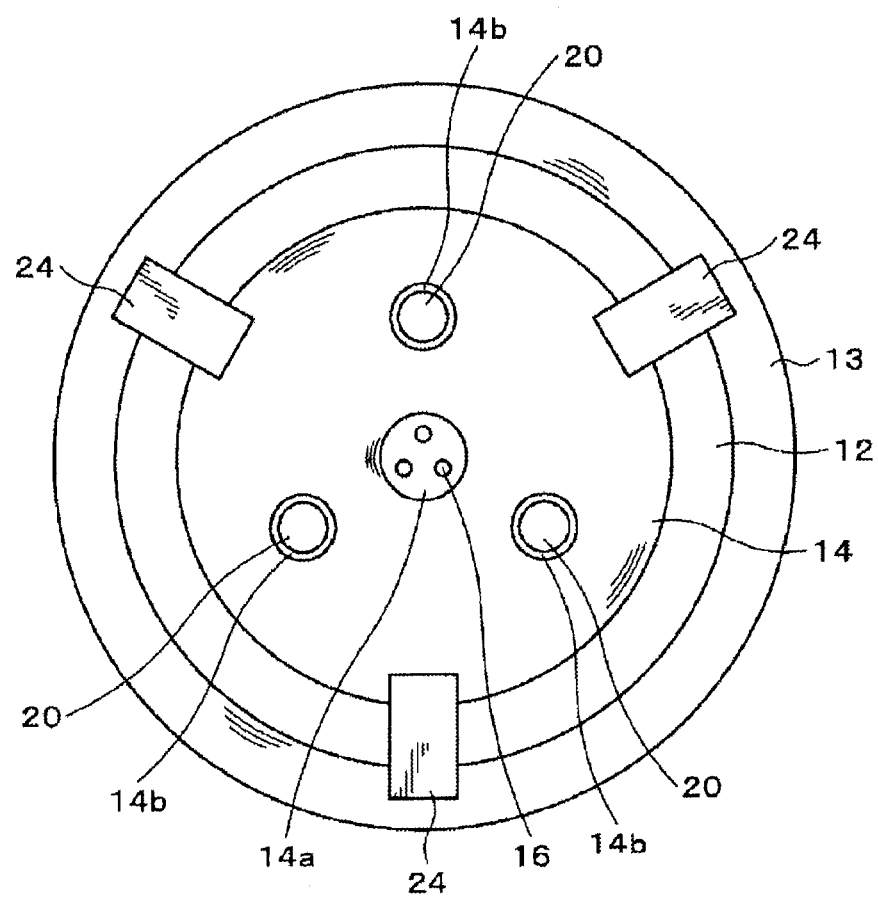
FIG. 10 is a top plan view illustrating a circuit board and a connection plate of the embodiment of FIGS. 9A and 9B.
Figure 11:
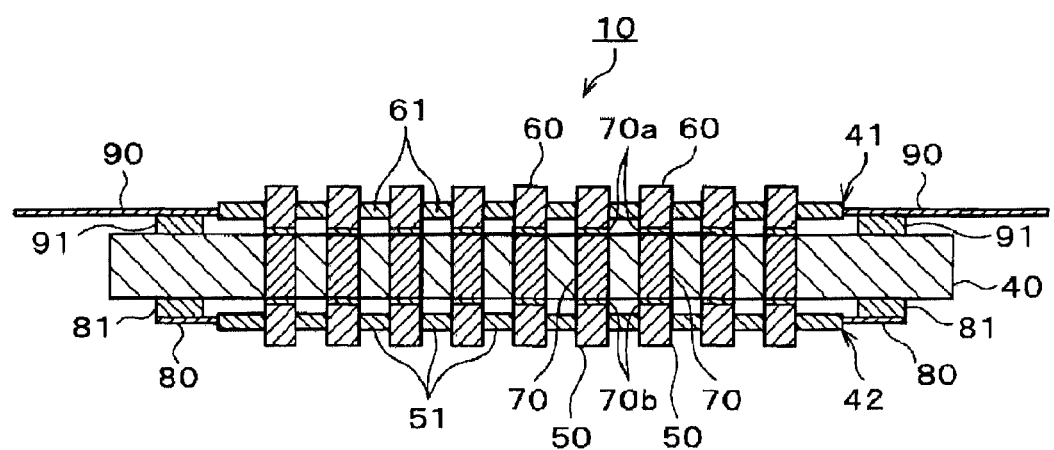
FIG. 11 is a cross-sectional view illustrating elements of the probe card of the embodiment of FIGS. 9A and 9B.

FIGS. 9A and 9B are cross-sectional views illustrating the wafer test apparatus 1 according to another embodiment of the inventive concepts. FIG. 10 is a top plan view illustrating the circuit board 12 and a connection plate 14 of FIGS. 9A and 9B. FIG. 11 is a cross-sectional view illustrating elements of the probe card 10 of FIGS. 9A and 9B.

In detail, in some embodiments, the wafer test apparatus 1 may include the test head 2 and the chuck 3 on which the wafer W to be tested is placed. The test head 2 may be disposed over the chuck 3, and the chuck 3 may vertically move. The test head 2 may be formed to have a substantially circular disk shape.

The test head 2 may include a support plate 11 that has a bottom surface supporting the probe card 10 that contacts an electrode pad U, and the circuit board 12 that is provided on a top surface of the support plate 11 and transmits an electrical signal for test to the probe card 10. An electronic circuit (not shown) for transmitting the electrical signal for test may be mounted in the circuit board 12. The electrical signal for test may be transmitted/received to/from the probe card 10 through the electronic circuit of the circuit board 12. Connection terminals 12a may be disposed on a bottom surface of the circuit board 12, and may be formed as parts of the electronic circuit of the circuit board 12.

A reinforcement member 13 for reinforcing the circuit board 12 may be provided on a top surface of the circuit board 12. The reinforcement member 13 may include a main body 13a that is disposed to be parallel to the top surface of the circuit board 12, and a fixing unit 13b that extends downward from an outer circumferential surface of the main body 13a and fixes an outer circumferential surface of the circuit board 12. The fixing unit 13b disposed on the circuit board 12 may protrude inward and outward such that the fixing unit 13b is disposed inside and outside the circuit board 12.

The connection plate 14 that is connected to the support plate 11 may be provided on the top surface of the circuit board 12 to be parallel to the circuit board 12. The connection plate 14 may be formed to have a circular disk shape with a diameter less than a diameter of the circuit board 12. The connection plate 14 may be provided under the main body 13a of the reinforcement member 13 and inside the fixing unit 13b. The connection plate 14 may function to correct a plan view of the circuit board 12 by contacting the top surface of the circuit board 12.

A connection pillar 15 for connecting and integrating the support plate 11 and the connection plate 14 may be fixed to a bottom surface of an outer circumferential surface of the connection plate 14. The connection pillar 15 may be formed to have a vertically long quadrangular pillar shape. A plurality of the connection pillars 15 may be provided, for example, four connection pillars 15, may be provided on an outer circumferential surface of the support plate 11. The connection pillars 15 may be arranged at regular intervals on the same circumference about the center of the support plate 11 as viewed from a top direction.

Each of the connection pillars 15 may pass through the circuit board 12 in a thickness direction such that a lower end portion of the connection pillar 15 reaches to the outside of the outer circumferential surface of the support plate 11. Two protrusions 15a that horizontally protrude toward the support plate 11 and hold the outer circumferential surface of the support plate 11 may be provided at lower portions of the connection pillar 15. In some embodiments, the protrusions 15a may be leaf spring members.

The protrusions 15a may hold the outer circumferential surface of the support plate 11 from the bottom and may maintain electrical contact between the support plate 11 and the circuit board 12 by pressing the support plate 11 toward the circuit board 12. A plurality of bolts 16, for example, three bolts 16, may be provided at a central portion of a top surface of the connection plate 14 as shown in FIG. 10. Upper end portions of the plurality of bolts 16 may be formed in a first recess 14a that is provided at the central portion of the top surface of the connection plate 14 as shown in FIGS. 9A and 9B. Each of the bolts 16 may pass through the circuit board 12 in the thickness direction, and a lower end portion of the bolt 16 may be fixed to the top surface of the support plate 11. The support plate 11 and the connection plate 14 may be connected by using the connection pillars 15 and the bolts 16, The circuit board horizontality adjustment unit 20 that maintains a constant contact weight between the probe card 10 and the electrode pad U may be provided on the top surface of the connection plate 14. In some embodiments, the circuit board horizontality adjustment unit 20 may include a spring member as a circuit board weight adjustment member 21.

In some embodiments, a plurality of the circuit board horizontality adjustment units 20, for example, three circuit board horizontality adjustment units 20, may be provided as shown in FIG. 10. The circuit board horizontality adjustment units 20 may be arranged at regular intervals on the same circumference about the center of the connection plate 14 when being seen from the top. In some embodiments, each of the circuit board horizontality adjustment units 20 may be provided in a second recess 14b that is formed in the top surface of the connection plate 14 as shown in FIGS. 9A and 9B.

Each of the circuit board horizontality adjustment units 20 may include the circuit board weight adjustment member 21 including a spring member that is disposed to vertically extend, a support unit 22 that supports the circuit board weight adjustment member 21 and is vertically extensible, and a circuit board weight sensor 23 that measures a weight applied to the circuit board 12. In some embodiments, the circuit board weight sensor 23 that measures a weight applied to the circuit board 12 may be provided in the second recess 14b. The circuit board horizontality adjustment unit 20 may contact the reinforcement member 13 and may maintain a predetermined or adjustable contact weight between the probe card 10 and the electrode pad U.

Even in a case where the probe card 10 and the electrode pad U contact each other at different heights, since the plurality of circuit board horizontality adjustment units 20 are provided, an in-plane distribution of a contact weight between the probe card 10 and the electrode pad U may be uniform. The number of the circuit board horizontality adjustment units 20 is not limited in the present embodiment, but, in some embodiments, may be three or more. The circuit board weight sensor 23 may be connected to the weight controller 100. The weight controller 100 may control a weight applied to the circuit board 12 to be a constant predetermined value based on a measurement result of the circuit board weight sensor 23.

For example, a contact weight between the probe card 10 and the electrode pad U may be changed by changing a height of the chuck 3, or by removing a failure factor, for example, a slope of the support plate 11, when an abnormal weight is measured. A predetermined contact weight may be set based on a material and a size of the probe card 10, for example, a material and a thickness of each of an upper elastic sheet 41 and a lower elastic sheet 42 and a diameter and the number of conductive units 50.

The probe card horizontality adjustment unit 300-1 (FIG. 9A) or 300-2 (FIG. 9B) for adjusting horizontality of the probe card 10 may be provided under the test head 2, that is, under the support plate 11, during a wafer test of the wafer W. In FIG. 9A, the probe card horizontality adjustment unit 2300-1 includes the probe card weight adjustment member 318 including a spring member. In FIG. 9B, the probe card horizontality adjustment unit 3002 includes the probe card weight adjustment member 318-2 including the probe card weight sensor 324 and the probe card actuator 326.

The probe card weight sensor 324 may be connected to the weight controller 100, and the probe card actuator 326 may be connected to the flow rate controller 130. Accordingly, the probe card horizontality adjustment unit 300-1 or 300-2 may function to adjust horizontality of the probe card 10 by directly adjusting a pressure applied to the probe card 10 as described above.

A leaf spring member 24 that is an elastic member is provided on the outer circumferential surface of the connection plate 14. One end of the leaf spring member 24 may be connected to the outer circumferential surface of the connection plate 14, and the other end of the leaf spring member 24 may be fixed to the fixing unit 13b of the reinforcement member 13. A plurality of the leaf spring members 24, for example, 3 left spring members 24, may be provided as shown in FIG. 10. In some embodiments, the leaf spring members 24 may be arranged at regular intervals on the same radius about the center of the connection plate 14 as viewed from the top direction.

A horizontal position of the support plate 11 may be fixed by using the leaf spring members 24. That is, even when a horizontal force is applied to the support plate 11 that supports the probe card 10 in a state where the probe card 10 and the electrode pad U contact each other, the support plate 11 does not move horizontally due to the leaf spring members 24. When a horizontal force is applied to the support 11, it may mean that the wafer W is slightly horizontally moved to achieve sufficient contact in a state where the probe card 10 and the electrode pad U contact each other. The number of the leaf spring members 24 is not limited in the present embodiment, but, in some embodiments, may be three or more.

The support plate 11 may be disposed to face the chuck 3 and to be parallel to the circuit board 12 as shown in FIGS. 9A and 9B. A plurality of connection terminals 11 a are provided on the top surface of the support plate 11. The connection terminals 11 a may be formed to correspond to the connection terminals 12a that are disposed on the bottom surface of the circuit board 12.

A plurality of intermediate members 30 for electrical communication with the connection terminals 11a and 12a may be provided between the connection terminals 11a of the support plate 11 and the connection terminals 12a of the circuit board 12 corresponding to the connection terminal 11a. The plurality of intermediate members 30 may be uniformly arranged in the top surface of the support plate 11 without an eccentric distribution. Each of the intermediate members 30 may be formed to independently vertically extend. Accordingly, even when the probe card 10 and the electrode pad U contact each other at different heights, the intermediate members 30 may uniformize an in-plane distribution of a contact weight between the probe card 10 and the electrode pad U.

Connection terminals 11b may be provided on the bottom surface of the support plate 11 at pitches less than those of the connection terminals 11a. The number of the connection terminals 11b may be the same as the number of the connection terminals 11a, and the connection terminals 11b corresponding to the connection terminals 11a may be respectively connected to the corresponding connection terminals 11 a. The support plate 11 may function as a pitch-changing substrate for changing an interval between the connection terminals 12a.

The probe card 10 that is supported on the bottom surface of the support plate 11 may have, in some embodiments, for example, a three-layer structure including an intermediate substrate 40 that is an intermediate body having a flat plate shape, the upper elastic sheet 41 that is mounted on a top surface of the intermediate substrate 40, and the lower elastic sheet 42 that is mounted on a bottom surface of the intermediate substrate 40. A plurality of the conductive units 50 having conductivity may be formed on the lower elastic sheet 42.

The conductive units 50 may be positioned to correspond with the electrode pads U. In some embodiments, each of the conductive units 50 vertically passes through the lower elastic sheet 42, protrudes in a convex shape from both vertical surfaces of the lower elastic sheet 42, and has a quadrangular pillar shape. A portion of the lower elastic sheet 42 other than the conductive units 50, that is, a portion that connects the conductive units 50, may be covered by an insulating unit 51 formed of only a rubber sheet.

The upper elastic sheet 41 may be formed of an insulating material having elasticity, for example, the same rubber sheet as that of the lower elastic sheet 42. A plurality of conductive units 60 having conductivity may be formed on the upper elastic sheet 41. The conductive units 60 may be arranged to correspond in position to, for example, the lower connection terminals 11b of the support plate 11. Each of the conductive units 60 may vertically pass through the upper elastic sheet 41 and may protrude in a convex shape from both vertical surfaces of the upper elastic sheet 41. A portion of the upper elastic sheet 41 other than the conductive units 60 may be an insulating unit 61.

The intermediate substrate 40 may have a stiffness that is higher than that of the upper elastic sheet 41 and the lower elastic sheet 42. A plurality of through-paths 70 may be formed in the intermediate substrate 40 to pass from the bottom surface to the top surface of the intermediate substrate 40. Each of the through-paths 70 may be configured to have a linear shape in a thickness direction of the intermediate substrate 40. Connection terminals 70a may be provided in upper end portions of the through-paths 70 and connection terminals 70b may be provided in lower end portions of the through-paths 70. The through-paths 70 of the intermediate substrate 40 may be configured to correspond in position in a one-to-one manner to the conductive units 50 of the lower elastic sheet 42 and the conductive units 60 of the upper elastic sheet 41. Accordingly, the connection terminals 70b of the through-paths 70 may correspond to the conductive units 50 of the lower elastic sheet 42. The connection terminals 70a of the through-paths 70 may correspond to the conductive units 60 of the upper elastic sheet 41.

The lower elastic sheet 42 may be fixed to a metal frame 80 that surrounds an outer circumferential surface of the lower elastic sheet 42. The metal frame 80 may have a quadrangular cross-sectional shape along the outer circumferential surface of the lower elastic sheet 42. The metal frame 80 may be adhered to a bottom surface of an outer circumferential surface of the intermediate substrate 40 by using, for example, an adhesive 81 having elasticity. Accordingly, the conductive units 50 of the lower elastic sheet 42 may respectively contact the connection terminals 70b of the through-paths 70 of the intermediate substrate 40.

The upper elastic sheet 41 may be fixed to a metal frame 90 that surrounds an outer circumferential surface of the upper elastic sheet 41. The metal frame 90 may have a quadrangular edge shape along the outer circumferential surface of the upper elastic sheet 41. The metal frame 90 may be adhered to a top surface of the outer circumferential surface of the intermediate substrate 40 by using an adhesive 91 having elasticity. Accordingly, the conductive units 60 of the upper elastic sheet 41 may respectively contact the connection terminals 70a of the through-paths 70 of the intermediate substrate 40. The chuck 3 may move in horizontal and vertical directions, and may be constructed and arranged to move the wafer W that is placed on the chuck 3 in three dimensions.

In the wafer test apparatus 1 in accordance with the inventive concepts, the probe card horizontality adjustment unit 300-1 or 300-2 may be provided on the support plate 11, and the circuit board horizontality adjustment unit 20 may be provided on the top surface of the connection plate 14. Accordingly, when the conductive unit 50 of the probe card 10 contacts the electrode pad U during a wafer test, a contact weight amount may be maintained. That is, a contact weight is not changed even when a position of the electrode pad U is changed. Accordingly, contact between the electrode pad U of the wafer W and the conductive unit 50 may be stabilized, and electrical characteristics of the electrode pad U may be appropriately tested.

In the wafer test apparatus 1, since the probe card horizontality adjustment unit 300-1 or 300-2 is provided on the support plate 11 and the plurality of circuit board horizontality adjustment units 20 are provided on the top surface of the connection plate 14, even in case where the plurality of conductive units 50 and the electrode pad U contact each other at different heights, all of the conductive units 50 and the electrode pads U may be brought into contact each other at a predetermined contact weight or force.

The wafer test apparatus 1 may uniformly apply an in-plane distribution of a contact weight between the conductive unit 50 and the electrode pad U. Since a predetermined contact weight between the electrode pad U and the conductive unit 50 is maintained due to the circuit board horizontality adjustment unit 20, the application of excessive weight to the probe card 10 can be avoided and, therefore, the durability, and reliability, of the probe card 10 may be improved.

In the wafer test apparatus 1, since the plurality of leaf spring members 24 that fix a horizontal position of the support 11 are provided on the outer circumferential surface of the connection plate 14, even when a horizontal force is applied to the support plate 11 in a state where the probe card 10 and the electrode pad U are in contact with each other, the support plate 11 is prevented from horizontally movement and may move in a vertical direction. Accordingly, the conductive unit 50 and the electrode pad U may be made to contact each other in an appropriate and reliable manner.

In the wafer test apparatus 1, the circuit board horizontality adjustment unit 20 includes the circuit board weight sensor 23 that detects and/or measures a weight applied to the circuit board 12. Accordingly, the weight controller 100 controls a weight applied to the circuit board 12 to be a constant value based on a measurement result of the circuit board weight sensor 23. Accordingly, even when an abnormal contact weight is applied between the conductive unit 50 and the electrode pad U, the conductive unit 50 and the electrode pad U may appropriately contact each other in response to the operation of the weight controller 100.

Figure 12:
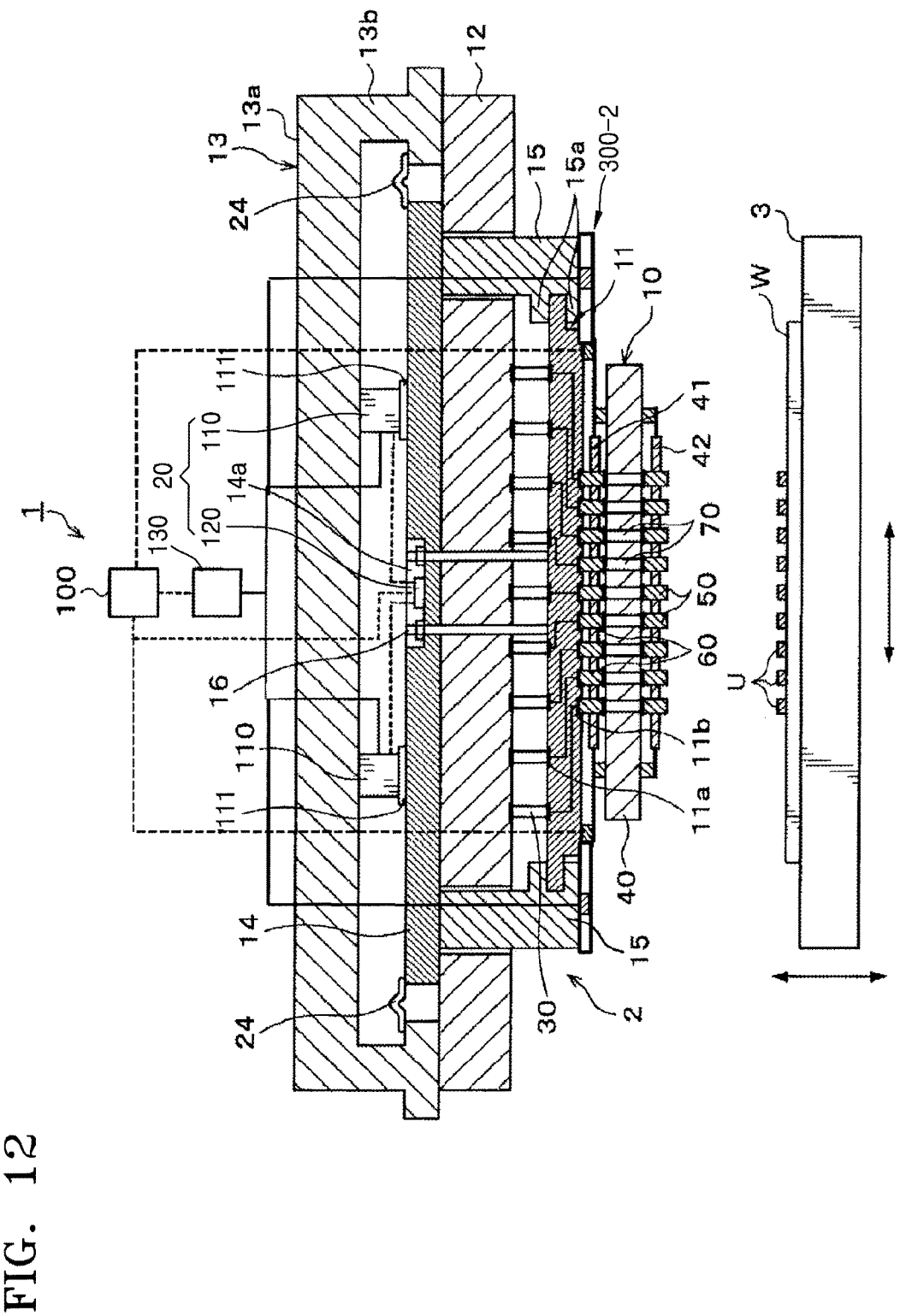
FIG. 12 is a cross-sectional view illustrating the wafer test apparatus according to another embodiment of the inventive concepts.

FIG. 12 is a cross-sectional view illustrating the wafer test apparatus 1 according to another embodiment of the inventive concepts.

In detail, the wafer test apparatus 1 of FIG. 12 is largely similar to the wafer test apparatus 1 of the embodiment of FIG. 9B except in that the circuit board horizontality adjustment unit 20 further includes a circuit actuator 110 and a circuit board weight sensor 120. The circuit board actuator 110 and the circuit board weight sensor 120 correspond to the probe card actuator 326 and the probe card weight sensor 24, and may perform in a manner similar to the probe card actuator 326 and the probe card weight sensor 24. In FIG. 12, the test head 2 and the wafer W placed on the chuck 3 are illustrated as being separated from each other for convenience of explanation. The wafer W placed on the chuck 3 may maintain horizontal and vertical movement to appropriately contact the probe card 10 of the test head 2.

The circuit board actuator 110 of FIG. 12 may generate a constant weight irrespective of a position of an action point of a weight by generating a predetermined propulsive force in a predetermined direction by using air pressure. Alternatively, the circuit board actuator 100 may generate a predetermined propulsive force by using electricity, or other force-inducing mechanism.

In some embodiments, the circuit board actuator 110 may be provided on the top surface of the connection plate 14 with a pressure member 111 therebetween. An upper end portion of the circuit board actuators 110 may be fixed to the reinforcement member 13. A plurality of the circuit board actuators 110, for example, three circuit board actuators 110, may be provided. Each of the circuit board actuators 110 may be provided in the first recess 14a, and may be connected to the circuit board weight sensor 120 that measures a weight of the circuit board actuator 110. The circuit board weight sensor 130 may be connected to the weight controller 100. In some embodiments, the plurality of circuit board actuators 110 may be connected to the flow rate controller 130. In some embodiments, the flow rate controller 130 may control the circuit board actuators 110 by supplying air pressure to the circuit board actuator 110. The flow rate controller 130 may be connected to the weight controller 100. Each of the circuit board actuators 110 may vertically move a piston rod (not shown), and a constant propulsive force may be maintained in the circuit board actuator 110 irrespective of a position at which the piston rod is stopped due to a pressure of the air supplied from the flow rate controller 130.

For example, even when the probe card 10 contacts the electrode pad U during a wafer test, a predetermined contact weight may be maintained. That is, the weight controller 100 may operate to control a contact weight between the probe card 10 and the electrode pad U to be relatively constant by adjusting a pressure of the air supplied from the flow rate controller 130 based on a measurement result of the circuit board weight sensor 120.

Figure 13:
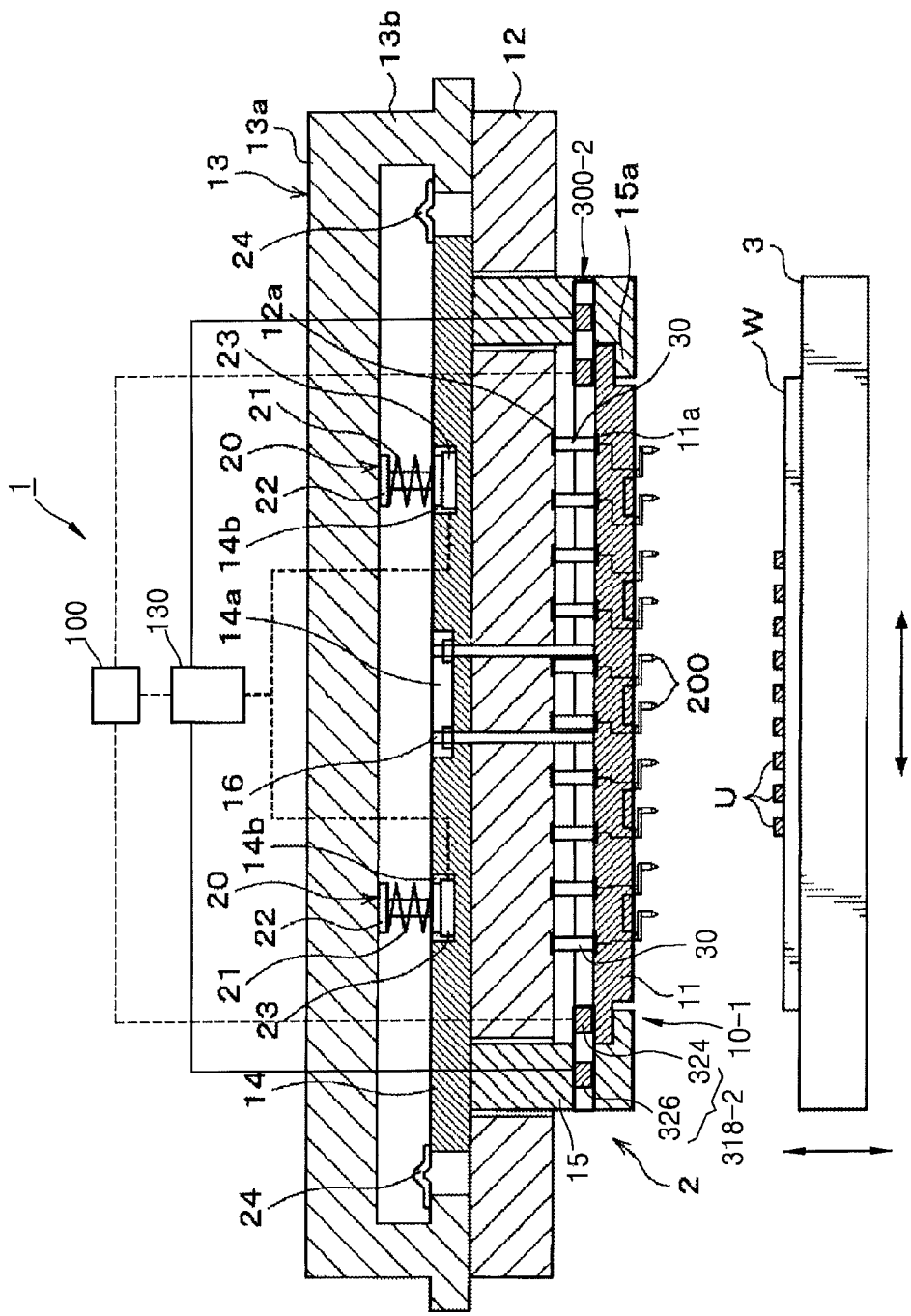
FIG. 13 is a cross-sectional view illustrating the wafer test apparatus according to another embodiment of the inventive concepts.
Figure 14:
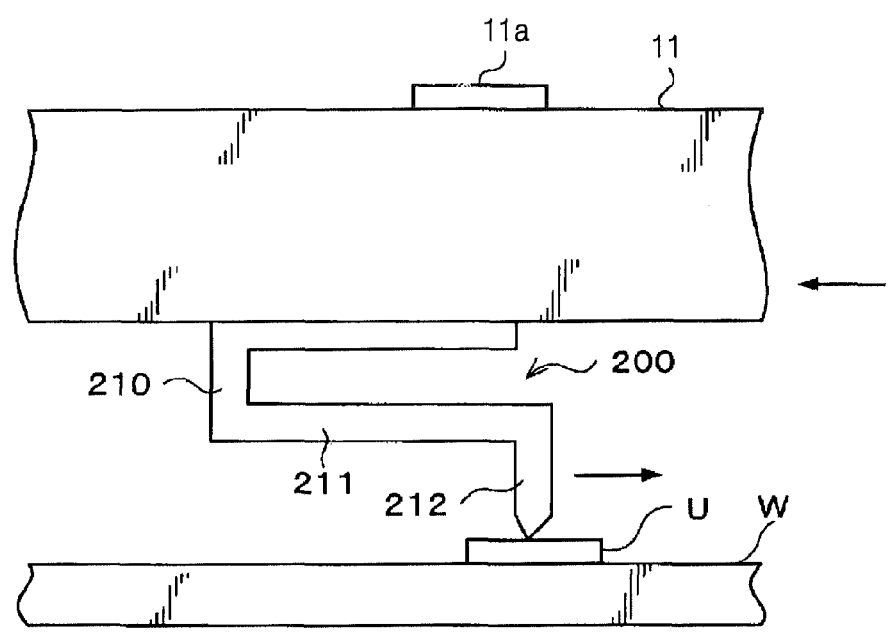
FIG. 14 is a cross-sectional view illustrating a contact state between the probe card and a wafer of the embodiment of FIG. 13.

FIG. 13 is a cross-sectional view illustrating the wafer test apparatus 1 according to another embodiment of the inventive concepts. FIG. 14 is a cross-sectional view illustrating a contact state between a probe card 10-1 and the wafer W of FIG. 13.

In detail, the wafer test apparatus 1 of FIG. 13 is largely similar to the wafer test apparatus 1 of FIGS. 9B and 12 except for the shape of the probe card 10-1. The probe card 10-1 of FIG. 13 may include a probe 200 having a cantilevered structure. The support plate 11 including the probe 200 having the cantilevered structure is provided under the bottom surface of the circuit board 12. The support plate 11 may function as the probe card 10-1 during a wafer test.

A plurality of the probes 200 each having the cantilevered structure may be provided on the bottom surface of the support plate 11 to correspond in position to the electrode pads U. The probes 200 each having the cantilevered structure may be electrically connected to the connection terminals 11*a* that are provided on the top surface of the support plate 11.

Each of the probes 200 having the cantilevered structure may include a support portion 210 that protrudes from the bottom surface of the support plate 11 as shown in FIG. 14. A cantilever unit 211 may be provided on a lower end of the support portion 210. A contactor 212 that extends downward in a direction perpendicular to the cantilever unit 211 may be provided on a free end portion of the cantilever unit 211.

Figure 15:
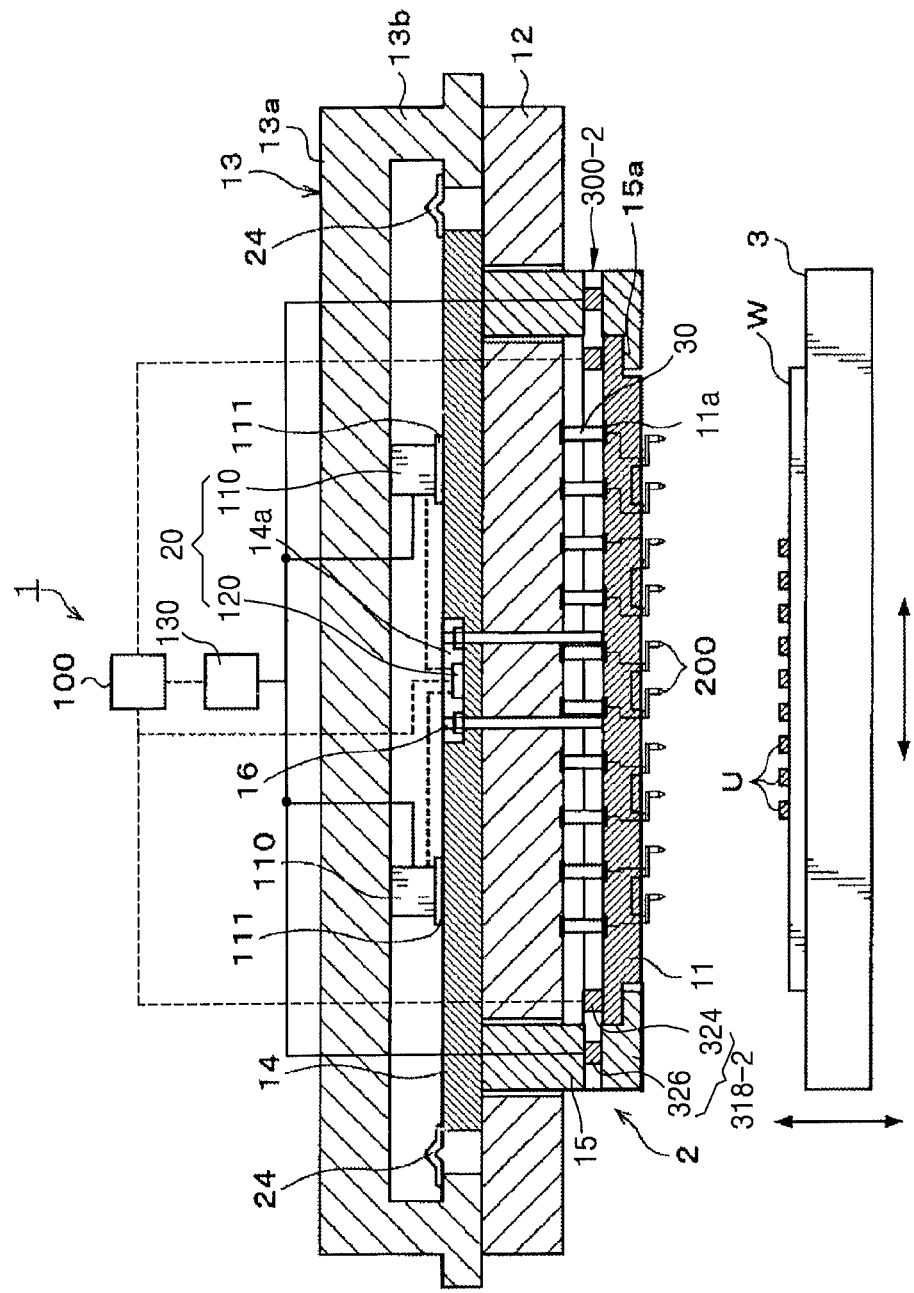
FIG. 15 is a cross-sectional view illustrating the wafer test apparatus according to another embodiment of the inventive concepts.

FIG. 15 is a cross-sectional view illustrating the wafer test apparatus 1 according to another embodiment of the inventive concepts.

In detail, the wafer test apparatus 1 of FIG. 15 largely similar to the wafer test apparatus 1 of FIG. 13 except in that the wafer test apparatus 1 includes the circuit board horizontality adjustment unit 20 including the circuit board actuator 110 and the circuit board weight sensor 120.

As described above, in the wafer test apparatus 1 of FIG. 15, the circuit board actuator 110 may be connected to the circuit board weight sensor 120 that measures a contact weight of, or force applied to, the circuit board 12. The circuit board weight sensor 120 may be connected to the weight controller 100. The circuit board actuator 110 may be connected to the flow rate controller 130. The flow rate controller 130 may be connected to the weight controller 100. The weight controller 100 may control a contact weight between the probe card 10 and the electrode pad U to be constant by adjusting a pressure of air supplied from the flow rate controller 130 based on a measurement result of the circuit board weight sensor 120.

Figure 16:
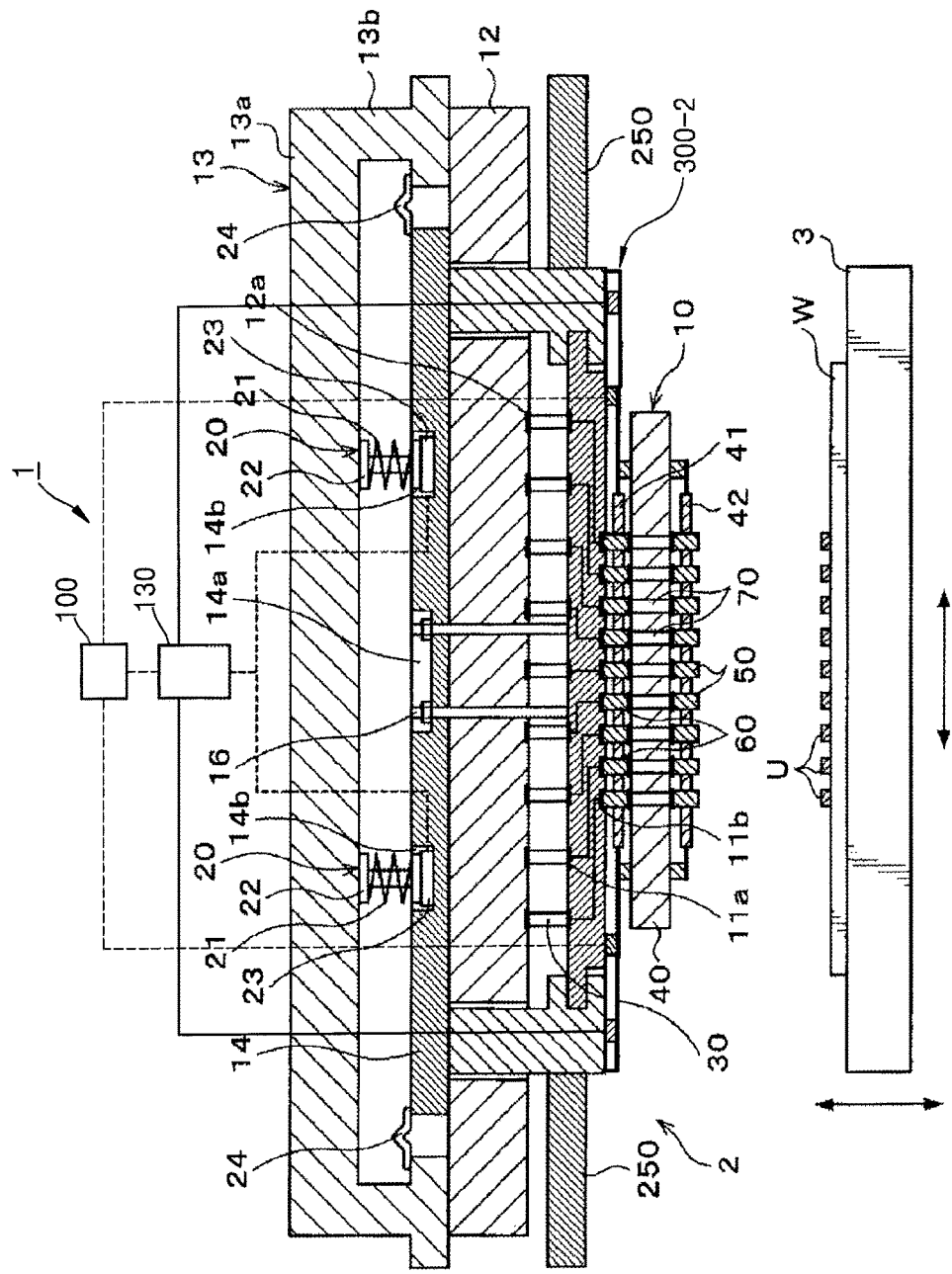
FIG. 16 is a cross-sectional view illustrating the wafer test apparatus according to another embodiment of the inventive concepts.

FIG. 16 is a cross-sectional view illustrating the wafer test apparatus 1 according to another embodiment of the inventive concepts.

In detail, the wafer test apparatus 1 of FIG. 16 is largely similar to the wafer test apparatus 1 of FIG. 9B except in that a guide member 250 that guides only a vertical movement of the support plate 11 is provided. In the wafer test apparatus 1 of FIG. 16, when a horizontal weight is relatively large, the guide member 250 may be further provided on an outer circumferential surface of the connection pillar 15. An outer circumferential surface of the guide member 250 may be supported by a holder (not shown). When the wafer W is lifted up in a state where the probe card 10 and the electrode pad U contact each other, the guide member 250 may guide a vertical movement of the support plate 11 by fixing a horizontal position of the support plate 11. Accordingly, the probe card 10 and the electrode pad U may be made to more appropriately contact each other.

Although the probe card 10 or 10-1 depicted in FIG. 15 has a three-layer structure including the intermediate substrate 40, the upper elastic sheet 41, and the lower elastic sheet 42 or includes the probe 200 having a cantilever structure in the above embodiments, a pogo pin probe may alternatively be used. That is, since a constant contact weight between the probe card 10 and the electrode pad U may be maintained due to the circuit board horizontality adjustment unit 20 or the probe card horizontality adjustment unit 300, any type of contactor may be used in the probe card 10.

A wafer test apparatus according to the one or more embodiments of the inventive concepts may include a probe card horizontality adjustment unit that is disposed under a test head and over a probe card. The probe card horizontality adjustment unit may maintain horizontality by directly adjusting a pressure applied to the probe card.

In addition, the wafer test apparatus may include a circuit board horizontality adjustment unit that is disposed in the test head. The circuit board horizontality adjustment unit may maintain horizontality of the probe card by adjusting horizontality of a circuit board that is coupled to the probe card.

While the inventive concepts have been particularly shown and described with reference to exemplary embodiments thereof, it will be understood that various changes in form and details may be made therein without departing from the spirit and scope of the following claims.

What is claimed is:

1. A wafer test apparatus comprising:
    a probe station comprising a probe card that contacts a wafer positioned on a chuck during a wafer test;
    a test head that is disposed on the probe card and tests electrical characteristics of a semiconductor chip positioned on the wafer; and
    a probe card horizontality adjustment unit positioned between the test head and the probe card that adjusts horizontality of the probe card during the wafer test,
    wherein the probe card horizontality adjustment unit comprises:
    an inner circumferential body having a through-hole,
    an outer circumferential body disposed about an outer circumferential surface of the inner circumferential body,
    a plurality of connection portions that connect the inner circumferential body and the outer circumferential body about the through-hole, and
    a probe card weight adjustment member that is provided on each of the plurality of connection portions and adjusts a force applied to the probe card.

2. The wafer test apparatus of claim 1, wherein the plurality of connection portions are provided opposite each other about the through-hole,
    wherein the probe card weight adjustment member is provided on the plurality of connection portions opposite each other about the through-hole.

3. The wafer test apparatus of claim 1, wherein the probe card weight adjustment member comprises a plurality of spring members that are provided on the plurality of connection portions.

4. The wafer test apparatus of claim 1, wherein the probe card weight adjustment member comprises a probe card weight sensor that measures the force applied to the probe card and a probe card actuator that adjusts the horizontality of the probe card.

5. The wafer test apparatus of claim 4, wherein a weight data electrical signal of the probe card weight sensor is input to a weight controller that is provided in the test head, the weight data electrical signal that is input to the weight controller being input to a flow rate controller that is provided in the test head, and the flow rate controller adjusting the probe card actuator according to the weight data electrical signal.

6. The wafer test apparatus of claim 1, wherein the test head comprises:
    a support plate that has a bottom surface supporting the probe card that contacts the wafer during the wafer test;
    a circuit board that is provided on a top surface of the support plate and transmitting an electrical signal for test to the probe card; and
    a connection plate that is provided on a top surface of the circuit board and is connected to the support plate through a connection pillar that passes through the circuit board.

7. The wafer test apparatus of claim 5, wherein a guide member that guides only a vertical movement of the support plate is provided on an outer circumferential surface of the connection pillar.

8. The wafer test apparatus of claim 6, wherein a circuit board horizontality adjustment unit that adjusts the horizontality of the circuit board connected to the probe card during the wafer test is provided on the connection plate.

9. The wafer test apparatus of claim 8, wherein the circuit board horizontality adjustment unit comprises a circuit board weight adjustment member that is provided on the connection plate and adjusts a weight of the probe card.

10. The wafer test apparatus of claim 9, wherein the circuit board weight adjustment member comprises a circuit board weight sensor that is provided on the connection plate and measures a weight applied to the circuit board, and a spring member that is disposed on the circuit board weight sensor.

11. The wafer test apparatus of claim 9, wherein the circuit board weight adjustment member comprises a circuit board weight sensor that is provided on the connection plate and measures a weight applied to the circuit board, and a circuit board actuator that adjusts horizontality of the circuit board.

12. The wafer test apparatus of claim 1, wherein the test head comprises:
    a support plate comprising a probe having a cantilever structure that contacts the wafer during the wafer test;
    a circuit board that is provided on a top surface of the support plate and transmits an electrical signal for test to the probe card; and
    a connection plate that is provided on a top surface of the circuit board and is connected to the support plate through a connection pillar that passes through the circuit board,
    wherein the support plate functions as the probe card during the wafer test.

13. A wafer test apparatus comprising:
    a probe station comprising a probe card that contacts a wafer placed on a chuck during a wafer test;
    a test head disposed on the probe card and that transmits an electrical signal for test to the probe card;
    a circuit board horizontality adjustment unit positioned on the circuit board of the test head and constructed and arranged to adjust horizontality of the circuit board during the wafer test; and
    a probe card horizontality adjustment unit positioned under the test head and constructed and arranged to adjust horizontality of the probe card during the wafer test,
    wherein the probe card horizontality adjustment unit comprises:
    an inner circumferential body having a through-hole,
    an outer circumferential body disposed about an outer circumferential surface of the inner circumferential body,
    a plurality of connection portions that connect the inner circumferential body and the outer circumferential body about the through-hole, and
    a probe card weight adjustment member that is provided on each of the plurality of connection portions and adjusts a force applied to the probe card.

14. A probe card horizontality adjustment unit for a test apparatus, comprising:
    an upper portion constructed and arranged to contact a test head of the test apparatus;
    a lower portion constructed and arranged to contact a probe card of the test apparatus; and
    a horizontality adjustment unit positioned at least one of the lower portion and upper portion that adjusts horizontality of a force applied to the probe card by the test head,
    wherein the horizontality adjustment unit comprises:
    a plurality of probe card force sensors that detect forces applied to the probe card by the test head at positions corresponding to the probe card force sensors, and
    a plurality of probe card actuators that adjust the horizontality of the probe card in response to the detected forces.

15. The probe card horizontality adjustment unit of claim 14 wherein the horizontality adjustment unit comprises a plurality of spring members arranged at the at least one of the lower portion and upper portion.

16. The probe card horizontality adjustment unit of claim 14 further comprising a force controller that receives force signals corresponding to the forces, and, in response to the received force signals, generates actuator signals for controlling the probe card actuators.

17. The probe card horizontality adjustment unit of claim 14 further comprising:
    an inner circumferential body between the upper portion and lower portion having an opening;
    an outer circumferential body disposed about the inner circumferential body; and
    a plurality of connection portions that connect the inner circumferential body and the outer circumferential body about the opening,
    wherein the horizontality adjustment unit is provided on the plurality of connection portions.

* * * * *